(12) United States Patent
Kobayashi et al.

(10) Patent No.: US 11,724,842 B2
(45) Date of Patent: Aug. 15, 2023

(54) COMPONENT MOUNTING SYSTEM AND TAPE SCRAPS COLLECTING DEVICE

(71) Applicant: Panasonic Intellectual Property Management Co., Ltd., Osaka (JP)

(72) Inventors: Hiroki Kobayashi, Fukuoka (JP); Naoki Azuma, Osaka (JP); Chikara Takata, Fukuoka (JP); Yuzo Asano, Fukuoka (JP); Toru Chikuma, Fukuoka (JP); Hiroshi Satoh, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/150,874

(22) Filed: Jan. 6, 2023

(65) Prior Publication Data

US 2023/0146855 A1 May 11, 2023

Related U.S. Application Data

(63) Continuation of application No. 17/647,196, filed on Jan. 6, 2022, now Pat. No. 11,584,552, which is a
(Continued)

(30) Foreign Application Priority Data

Apr. 18, 2018 (JP) .................................. 2018-079725
Apr. 18, 2018 (JP) .................................. 2018-079726

(51) Int. Cl.
*B65B 15/04* (2006.01)
*B65G 47/68* (2006.01)
(Continued)

(52) U.S. Cl.
CPC .............. *B65B 15/04* (2013.01); *B65G 47/68* (2013.01); *H05K 13/02* (2013.01); *H05K 13/0417* (2013.01)

(58) Field of Classification Search
CPC .... H05K 13/02; H05K 13/04; H05K 13/0417; B65B 15/04; B65G 47/68
(Continued)

(56) References Cited

U.S. PATENT DOCUMENTS 7,395,129 B2 7/2008 Yamazaki et al.
8,328,498 B2 12/2012 Higashida
(Continued)

FOREIGN PATENT DOCUMENTS

JP 2000-013095 A 1/2000
JP 2011-071257 A 4/2011
(Continued)

OTHER PUBLICATIONS

International Search Report of PCT application No. PCT/JP2019/003293 dated Apr. 9, 2019.

*Primary Examiner* — Douglas A Hess
(74) *Attorney, Agent, or Firm* — Pearne & Gordon LLP

(57) ABSTRACT

A component mounting system including: a component mounting device group in which a plurality of component mounting devices that mount components supplied to a board transported in from an upstream side by a tape feeder and transport out the board to a downstream side, and cut a carrier tape after supplying the components by a cutter device and discharge scraps of carrier tape, are installed on a floor surface while being arranged in a direction of conveying the board; a main conveyor that is installed along an arrangement direction of the plurality of component mounting devices in a region on the floor surface under the component mounting device group, and transports the scraps
(Continued)

of carrier tape discharged from each of the plurality of component mounting devices; and a scraps storage that is installed outside the region and stores the scraps of carrier tape transported by the main conveyor.

8 Claims, 12 Drawing Sheets

Related U.S. Application Data continuation of application No. 16/930,458, filed on Jul. 16, 2020, now Pat. No. 11,254,456, which is a continuation of application No. PCT/JP2019/003293, filed on Jan. 31, 2019.

(51) Int. Cl.
*H05K 13/02* (2006.01)
*H05K 13/04* (2006.01)

(58) Field of Classification Search
USPC .................................. 29/739, 832; 700/121
See application file for complete search history.

(56) References Cited

U.S. PATENT DOCUMENTS

| | | |
|---|---|---|
| 8,375,570 B2 | 2/2013 | Nagao |
| 8,646,676 B2 | 2/2014 | Nagao |
| 8,833,634 B2 | 9/2014 | Nagao |
| 9,820,420 B2 | 11/2017 | Ohyama et al. |
| 9,949,417 B2 | 4/2018 | Morikawa |
| 10,015,919 B2 * | 7/2018 | Takata ............... H05K 13/0417 |
| 10,045,470 B2 | 8/2018 | Sumi |
| 10,064,320 B2 | 8/2018 | Kawai et al. |
| 10,206,318 B2 | 2/2019 | Matsumoto et al. |
| 10,278,319 B2 | 4/2019 | Honda et al. |
| 10,426,069 B2 | 9/2019 | Ohashi et al. |
| 10,477,751 B2 | 11/2019 | Hayashi |
| 10,561,050 B2 | 2/2020 | Iisaka et al. |
| 10,881,041 B2 | 12/2020 | Hara |
| 10,960,999 B2 * | 3/2021 | Eguchi ............... B65H 19/1852 |
| 11,382,246 B2 | 7/2022 | Fujie |
| 11,464,149 B2 | 10/2022 | Kawai et al. |
| 2020/0323111 A1 | 10/2020 | Sugihara et al. |
| 2021/0176906 A1 | 6/2021 | Terasawa |
| 2021/0204457 A1 | 7/2021 | Amma et al. |

FOREIGN PATENT DOCUMENTS

| | | |
|---|---|---|
| JP | 2013-175618 A | 9/2013 |
| WO | 2015/045018 A1 | 4/2015 |

* cited by examiner

COMPONENT MOUNTING SYSTEM AND TAPE SCRAPS COLLECTING DEVICE

CROSS-REFERENCE TO RELATED APPLICATIONS

This is a continuation of U.S. patent application Ser. No. 17/647,196 filed on Jan. 6, 2022 which is a continuation of U.S. patent application Ser. No. 16/930,458 filed on Jul. 16, 2020 which is a continuation of the PCT International Application No. PCT/JP2019/003293 filed on Jan. 31, 2019, which claims the benefit of foreign priority of Japanese patent applications No. 2018-079725 and No. 2018-079726 both filed on Apr. 18, 2018, the contents all of which are incorporated herein by reference.

BACKGROUND

1. Technical Field

The present disclosure relates to a component mounting system and a tape scraps collecting device including a component mounting device group in which a plurality of component mounting devices that mount components supplied by a tape feeder on a board are installed while being arranged in a direction of conveying the board.

2. Description of the Related Art

In a component mounting system, in addition to a component mounting device group in which a plurality of component mounting devices are installed while being arranged on a floor surface in a direction of conveying the board, a solder printer, an inspection machine, a reflow device, and the like are provided. Each component mounting device that configures the component mounting device group mounts components on the board that has been conveyed from the upstream side and conveys the components to the downstream side. There are various types of devices for supplying components, and a tape feeder is known as one of the types.

The tape feeder pitch-feeds a carrier tape in which multiple components are accommodated while being arranged in a line and supplies the components to a component supply position. The tape feeder is supported by a feeder cart, and the feeder cart includes a cutter device that cuts the carrier tape after supplying the components, and a duct that discharges scraps by cutting the carrier tape with the cutter device and dropping the generated scraps of carrier tape, are provided. The scraps of carrier tape discharged through the duct are stored in a container provided in the feeder cart. The scraps of carrier tape stored in the container are regularly discarded by an operator who goes around the component mounting device group. In a case where the number of component mounting devices is large and the number of tape feeders provided in each component mounting device is large, the labor for discarding the scraps of carrier tape is enormous. Therefore, it is important from the viewpoint of labor saving to improve the processing of the scraps of carrier tape.

Regarding the collection of the scraps of carrier tape, for example, International Publication No. 2015/045018 discloses a configuration in which a waste tape transport device is provided inside a component mounting device. When the plurality of component mounting devices are connected to each other, the waste tape transport devices are adjacent to each other, and the scraps of carrier tape discharged from each component mounting device are carried while being delivered between the waste tape transport devices. Since the scraps of carrier tape generated from each component mounting device are collected in the waste tape transport device of the component mounting device positioned on the most downstream side, the operator may collect the scraps of carrier tape from the component mounting device positioned on the most downstream side without going around each component mounting device, and it is possible to efficiently collect the scraps of carrier tape.

SUMMARY

According to an aspect of the present disclosure, there is provided a component mounting system including: a component mounting device group in which a plurality of component mounting devices that mount components supplied to a board conveyed in from an upstream side by a tape feeder and convey the board to a downstream side, and cut a carrier tape after supplying the components by a cutter device and discharge scraps of carrier tape, are installed on a floor surface while being arranged in a direction of conveying the board; a main conveyor that is installed along an arrangement direction of the plurality of component mounting devices in a region on the floor surface under the component mounting device group, and conveys the scraps of carrier tape discharged from each of the plurality of component mounting devices; and a scraps storage that is installed outside the region and stores the scraps of carrier tape conveyed by the main conveyor.

According to another aspect of the present disclosure, there is provided a tape scraps collecting device that collects scraps from a component mounting device group in which a plurality of component mounting devices that mount components supplied to a board conveyed from an upstream side by a tape feeder and convey the board to a downstream side, and cut a carrier tape after supplying the components by a cutter device and discharge scraps of carrier tape, are installed on a floor surface while being arranged in a direction of conveying the board, the device including: a main conveyor that is installed along an arrangement direction of the plurality of component mounting devices in a region on the floor surface under the component mounting device group, and conveys the scraps of carrier tape discharged from each of the plurality of component mounting devices; and a scraps storage that is installed outside the region and stores the scraps of carrier tape conveyed by the main conveyor.

According to the present disclosure, it is possible to inexpensively construct a scraps collecting mechanism that collects the scraps of carrier tape generated from the tape feeder of each component mounting device in one place.

DETAILED DESCRIPTION OF PREFERRED EMBODIMENTS

In the configuration illustrated in International Publication No. 2015/045018, it is necessary that each component mounting device has a waste tape transport device embedded therein. Therefore, when an attempt is made to construct a scraps collecting mechanism that collects scraps of carrier tape generated from a tape feeder of each component mounting device in one place, there is a problem that it may take a large amount of costs including the design change of the existing component mounting device.

An object of the present disclosure is to provide a component mounting system that can inexpensively construct a scraps collecting mechanism that collects scraps of carrier tape generated from a tape feeder of each component mounting device in one place.

Figure 1:
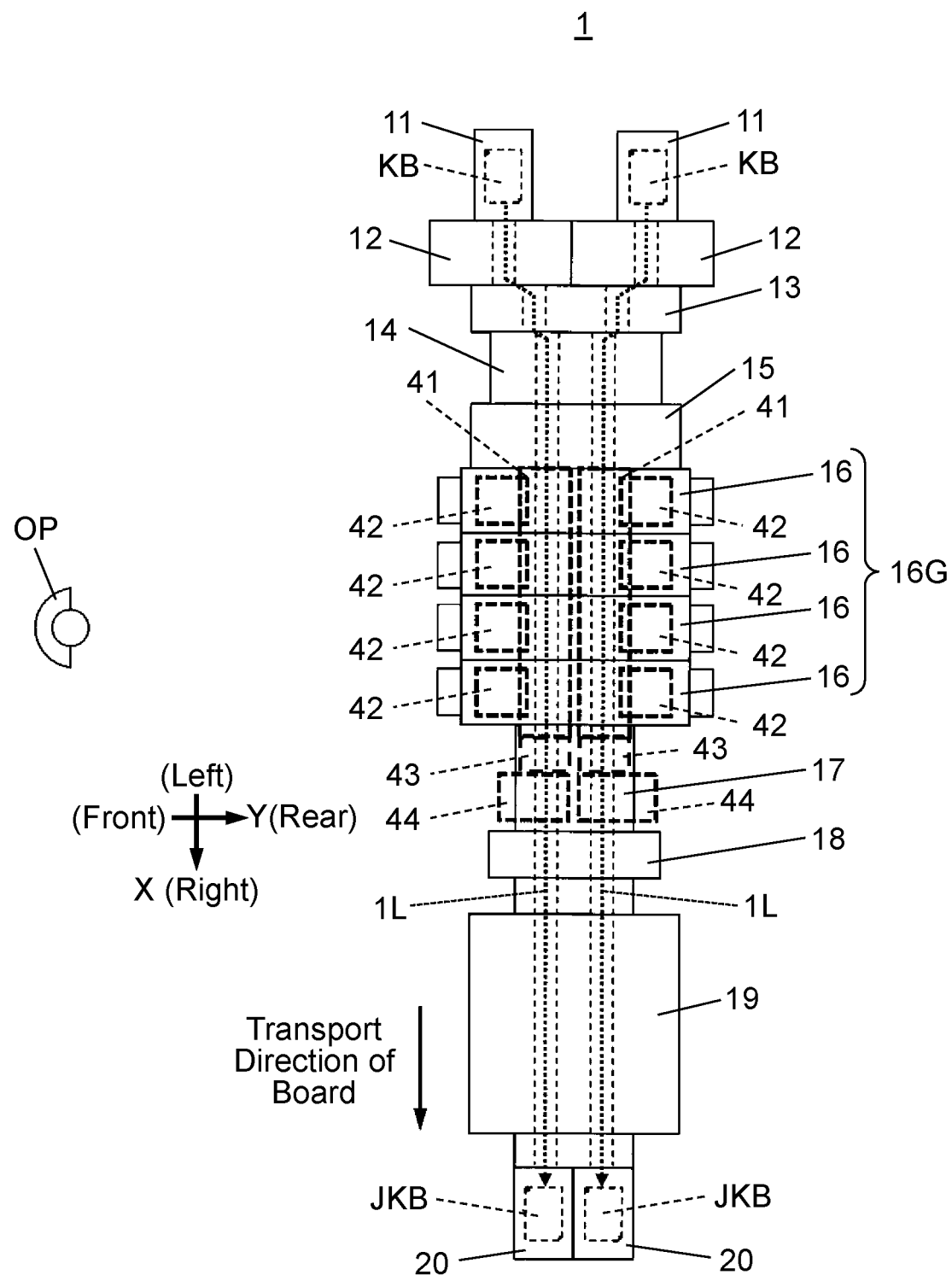
FIG. 1 is a plan view of a component mounting system according to an embodiment of the present disclosure.

Hereinafter, embodiments of the present disclosure will be described with reference to the drawings. FIG. 1 illustrates component mounting system 1 according to an embodiment of the present disclosure. Component mounting system 1 is an apparatus that mounts components on board KB to manufacture mount board JKB, and is installed on the floor surface. Component mounting system 1 includes board supply device 11, screen printing device 12, slide conveyor 13, first relay conveyor 14, solder inspection device 15, component mounting device 16, second relay conveyor 17, post-mounting inspection device 18, reflow device 19, and mount board collecting device 20, and these devices are arranged in series in this order from the left side when viewed from operator OP. In the present embodiment, the left-right direction (the direction of conveying board KB) viewed from operator OP is the X-axis direction, and the front-rear direction viewed from operator OP is the Y-axis direction. In addition, the up-down direction is the Z-axis direction.

In FIG. 1, component mounting system 1 has two board conveying paths 1L extending in the X-axis direction at the front and rear when viewed from operator OP, and the component mounting work on board KB can be performed at the same time in parallel in these two board conveying paths 1L. Therefore, in the present embodiment, two board supply devices 11, two screen printing devices 12, and two mount board collecting devices 20 are arranged in the front-rear direction, and slide conveyor 13, first relay conveyor 14, solder inspection device 15, four component mounting devices 16, second relay conveyor 17, post-mounting inspection device 18, and reflow device 19 respectively have two board conveyors at the front and rear.

Board supply device 11 stocks a plurality of boards KB and supplies boards KB one by one to the downstream side. Screen printing device 12 screen-prints solder on board KB supplied from board supply device 11 and conveys the board to the downstream side. Slide conveyor 13 distributes and conveys board KB conveyed from screen printing device 12 to two board conveying paths 1L. First relay conveyor 14 receives board KB conveyed from slide conveyor 13 and conveys the board to the downstream side.

Solder inspection device 15 performs a solder inspection of board KB received from first relay conveyor 14. In the solder inspection, it is inspected whether or not a predetermined amount of solder is printed at a predetermined position on board KB. Component mounting device 16 mounts components on board KB that has been sent from the upstream side and conveys the board to the downstream side. In the present embodiment, four component mounting devices 16 are connected to each other in series on floor surface FL to configure component mounting device group 16G (refer to also FIG. 2). The configuration of component mounting device 16 that configures component mounting device group 16G will be described later.

Second relay conveyor 17 receives board KB conveyed from component mounting device 16 positioned on the most downstream side of component mounting device group 16G by conveyor mechanism 17C (FIG. 2) and conveys the board to the downstream side. Post-mounting inspection device 18 performs component mounting inspection on board KB received from second relay conveyor 17. In the component mounting inspection, it is inspected whether or not the component is attached at a predetermined position on board KB in a predetermined direction. Post-mounting inspection device 18 conveys board KB to which the component mounting inspection has been completed to the downstream side.

Reflow device 19 performs solder reflow while conveying board KB after the component mounting inspection, which is conveyed from post-mounting inspection device 18. Accordingly, after the solder on board KB is melted, the solder is cooled and solidified, and each component mounted on board KB by component mounting device group 16G is fixed to board KB. Reflow device 19 conveys mount board JKB generated in this manner to the downstream side. Mount board collecting device 20 receives, collects, and stocks mount board JKB conveyed from reflow device 19.

Figure 3:
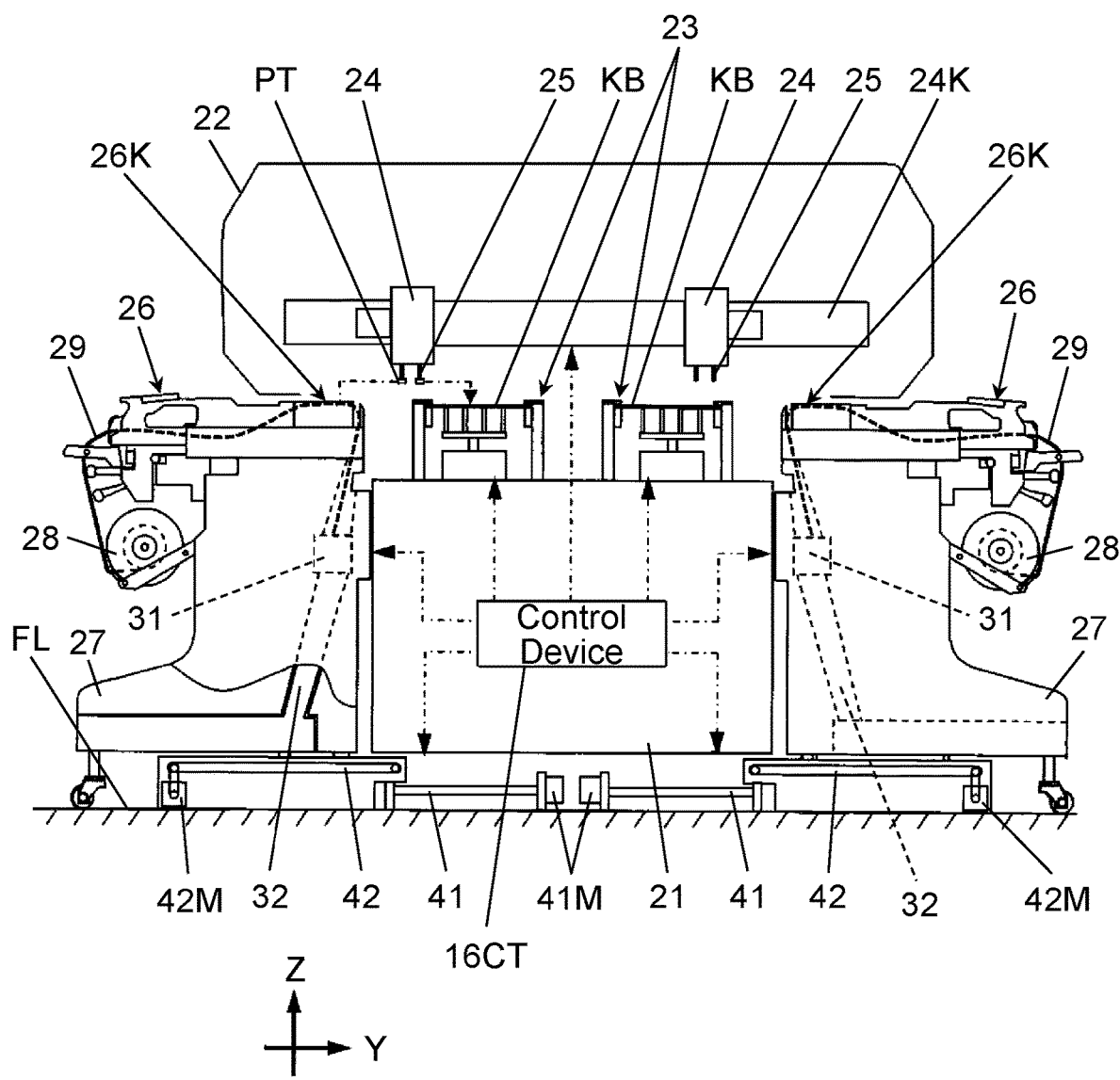
FIG. 3 is a side view of a component mounting device that configures a component mounting system according to the embodiment of the present disclosure.

As illustrated in FIG. 3, component mounting device 16 includes two board conveyors 23 and two mounting heads 24 in a space between base 21 and cover member 22. Two board conveyors 23 are arranged at the front and rear, and each extends in the X-axis direction (the direction perpendicular to the paper surface of FIG. 3). These two board conveyors 23 configure a part of two board conveying paths 1L of component mounting system 1.

Each board conveyor 23 receives and conveys board KB that has been sent from the upstream side, and positions the board at a predetermined working position. Two mounting heads 24 are arranged at the front and rear, and each has suction nozzle 25 extending downward. These two mounting heads 24 are moved in the horizontal plane by head moving mechanism 24K.

Figure 2:
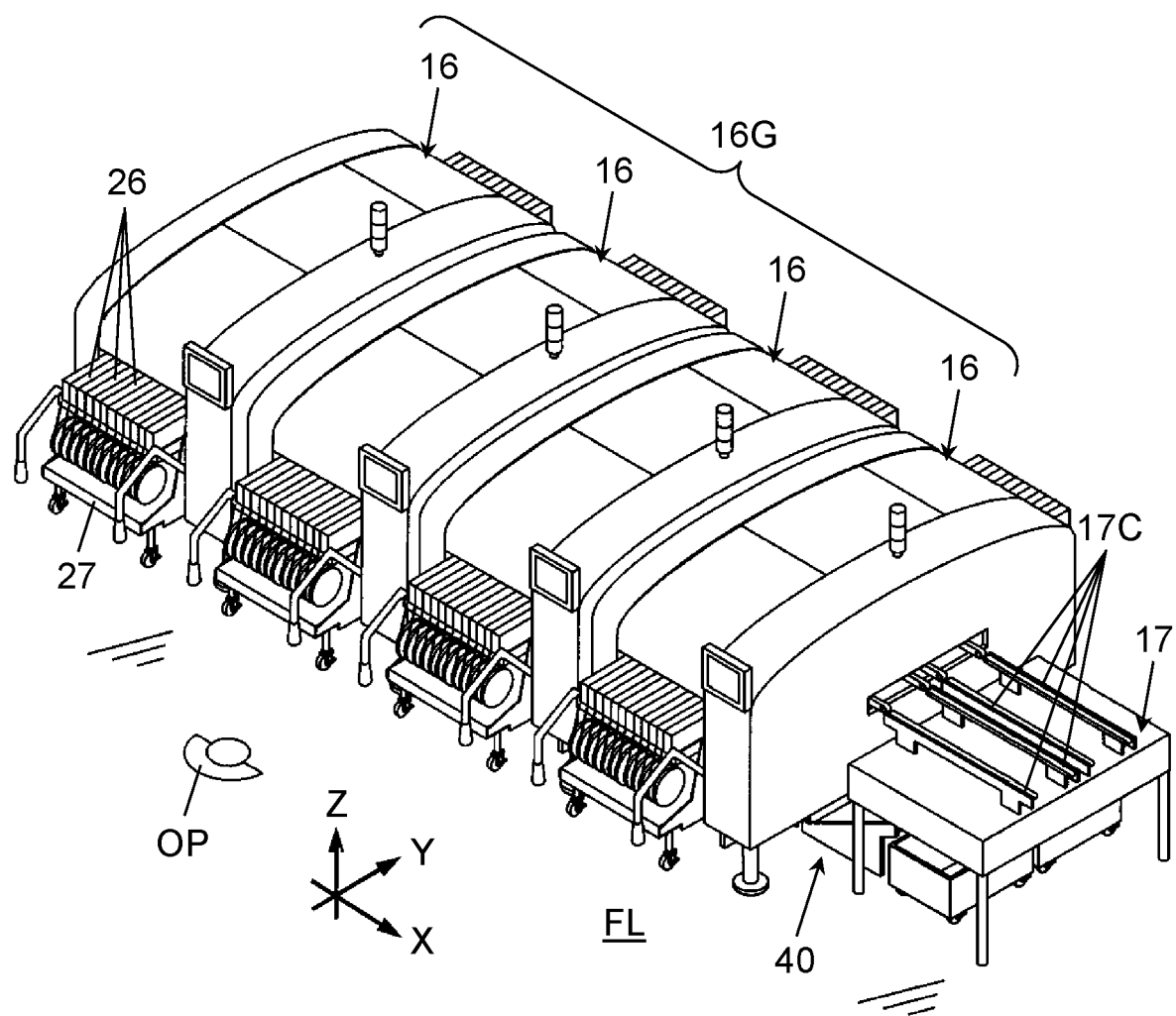
FIG. 2 is a perspective view of a part of the component mounting system according to the embodiment of the present disclosure.

In FIGS. 2 and 3, a plurality of tape feeders 26 are provided while being arranged in the X-axis direction respectively at the front and rear of base 21. Each tape feeder 26 is supported by feeder cart 27 connected to each of the front and rear of base 21. By connecting feeder cart 27 to base 21, the plurality of tape feeders 26 are collectively attached to base 21.

In FIG. 3, feeder cart 27 is provided with a plurality of tape reels 28 corresponding to each tape feeder 26. Carrier tape 29 that accommodates the components therein is wound around each tape reel 28. Tape feeder 26 supplies component PT to component supply port 26K by pulling out carrier tape 29 from corresponding tape reel 28 and pitch-feeding the carrier tape. By suctioning component PT supplied to component supply port 26K by each tape feeder 26 and moving the component by head moving mechanism 24K, mounting head 24 mounts the component onto board KB positioned at the working position by board conveyor 23. Board KB on which component PT is mounted is conveyed by board conveyor 23 to the downstream side. The operation of each part of component mounting device 16 is controlled by control device 16CT included in component mounting device 16.

In this manner, each component mounting device 16 performs a series of component mounting operations in which component PT supplied by tape feeder 26 is mounted on board KB conveyed from the upstream side and is conveyed to the downstream side. By performing the component mounting operation while four component mounting devices 16 that configure component mounting device group 16G are adjacent to each other and deliver board KB, board KB on which components PT in component mounting device group 16G have been mounted is conveyed from component mounting device 16 positioned on the most downstream side.

Figure 4:
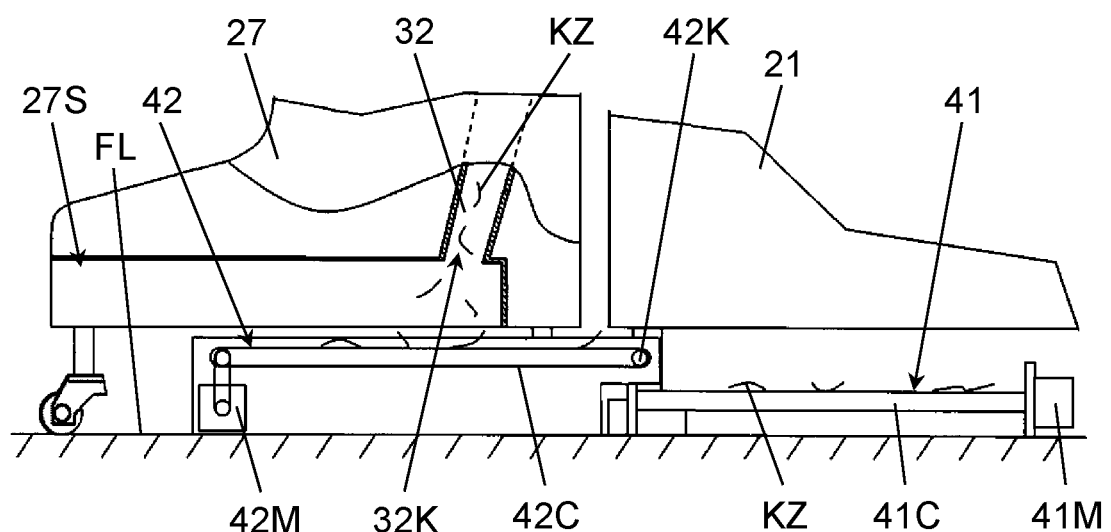
FIG. 4 is a side view of a lower portion of the component mounting device that configures the component mounting system according to the embodiment of the present disclosure.

In FIG. 3, cutter device 31 and duct 32 are provided on each feeder cart 27 at the front and rear in each component mounting device 16. Cutter device 31 cuts carrier tape 29 after supplying components PT in each tape feeder 26. Duct 32 is provided below cutter device 31, and guides scraps KZ of carrier tape 29, which is cut by cutter device 31 and drops by the own weight, to duct opening 32K opened at the lower portion of feeder cart 27 (FIG. 4).

Figure 5:
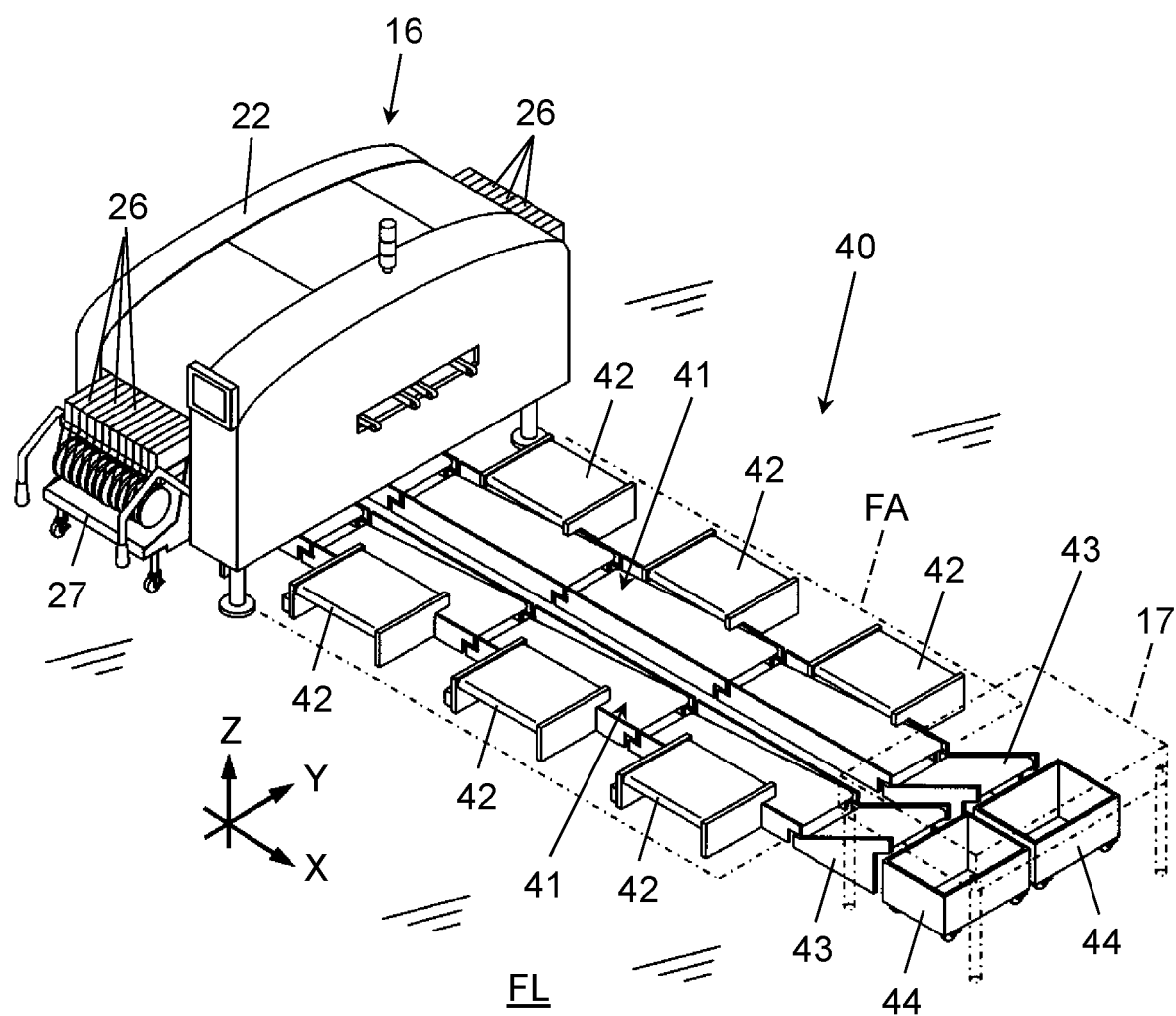
FIG. 5 is a perspective view of a part of the component mounting system according to the embodiment of the present disclosure.
Figure 6:
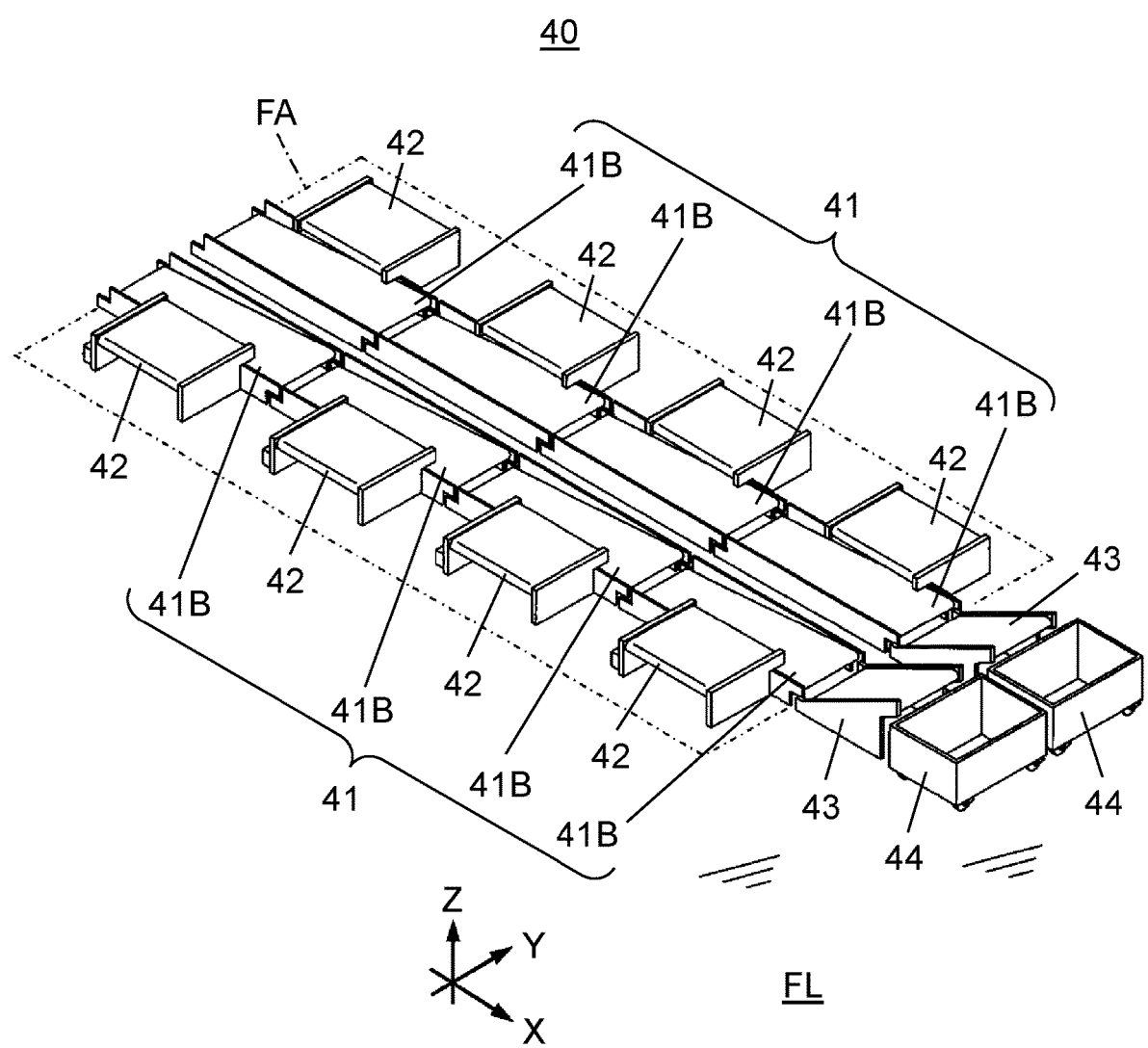
FIG. 6 is a perspective view of a scraps collecting mechanism that configures the component mounting system according to the embodiment of the present disclosure.

In this manner, scraps KZ of carrier tape 29 are generated from each component mounting device 16 that configures component mounting device group 16G, and the amount of scraps KZ of carrier tape 29 generated in the entire component mounting device group 16G is enormous. Component mounting system 1 in the present embodiment includes scraps collecting mechanism 40 (tape scraps collecting device) for automatically collecting and discarding a large amount of scraps KZ of carrier tape 29 generated from component mounting device group 16G in one place without manual labor (FIGS. 2, 5, and 6). Scraps collecting mechanism 40 will be described below.

In FIGS. 5 and 6, scraps collecting mechanism 40 includes main conveyor 41, sub-conveyor 42, disposing conveyor 43, and storage box 44. Main conveyor 41 is installed in region FA covered with component mounting device group 16G on floor surface FL. Main conveyor 41 is installed such that the conveying direction is oriented in the arrangement direction (X-axis direction) of four component mounting devices 16. At the end portion (the end portion on the right side when viewed from operator OP) on the downstream side of main conveyor 41 in the conveying direction (X-axis direction), component mounting device 16 positioned on the most downstream side is positioned in the vicinity of the right end portion.

In the present embodiment, component mounting system 1 has two board conveying paths 1L at the front and rear, and two feeder carts 27 at the front and rear are connected to each other in each component mounting device 16 corresponding to two board conveying paths 1L. Therefore, in the present embodiment, two main conveyors 41 are installed while being arranged in the Y-axis direction corresponding to two board conveying paths 1L provided in component mounting system 1 (that is, corresponding to the rows of feeder carts 27). Two main conveyors 41 are installed in region FA of floor surface FL under component mounting device group 16G at a step before component mounting system 1 is installed on floor surface FL or in a process in which component mounting system 1 is installed on floor surface FL.

Figure 7:
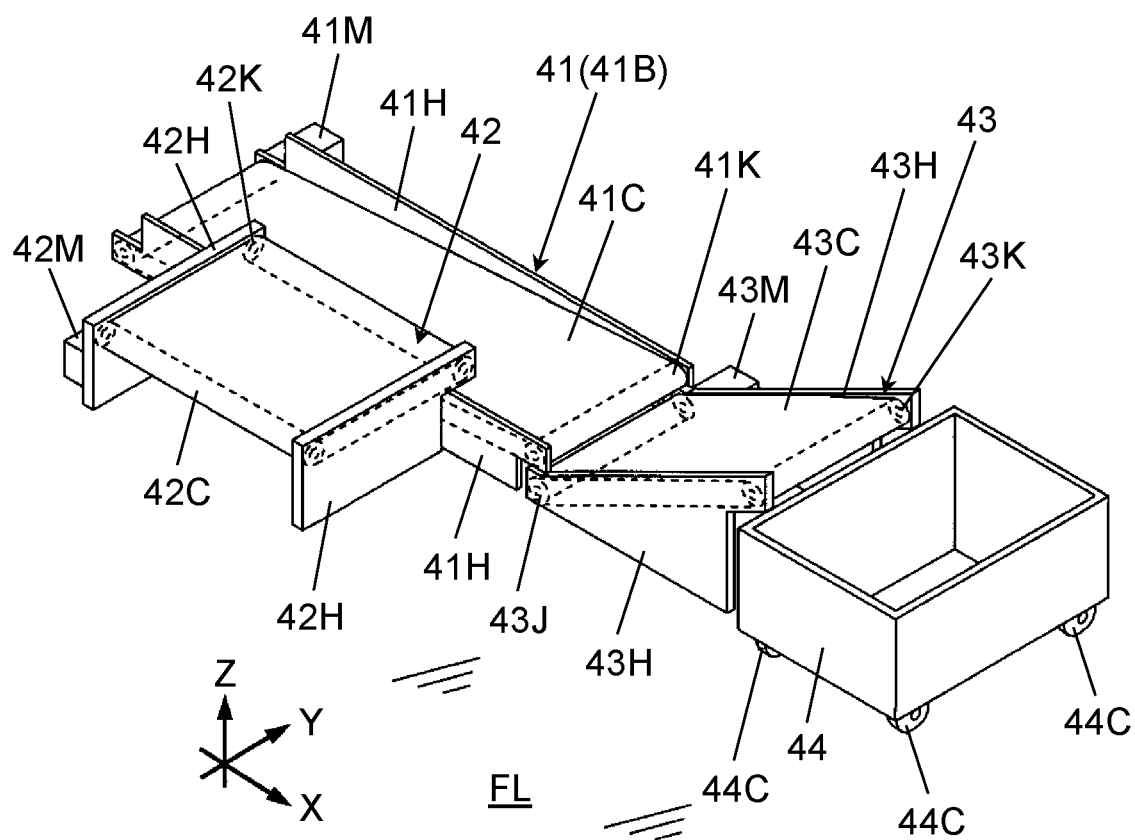
FIG. 7 is a perspective view of a part of the scraps collecting mechanism according to the embodiment of the present disclosure.

Each main conveyor 41 may be one long conveyor extending in the X-axis direction, but in the present embodiment, a plurality of conveyor devices 41B are connected to each other in series (FIG. 6). As illustrated in FIG. 7, one conveyor device 41B has a configuration in which motor 41M drives belt 41C supported by two side walls 41H that are provided to face each other (here, face each other in the Y-axis direction) in the horizontal direction. The operation of motor 41M is controlled by a host control system (not illustrated) that controls the overall operation of component mounting system 1.

Figure 8:
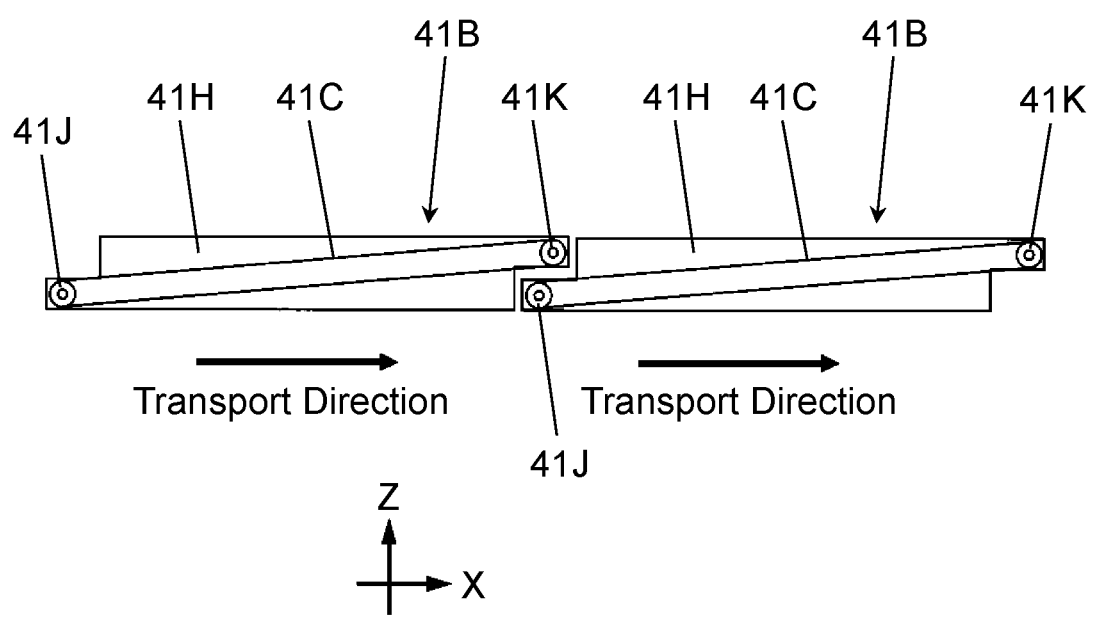
FIG. 8 is a view illustrating a state where two conveyor devices that configure a main conveyor of the scraps collecting mechanism according to the embodiment of the present disclosure are connected to each other.

In FIG. 7, belt 41C of conveyor device 41B is inclined such that the conveying direction is a direction of the slope from the upstream side to the downstream side in the direction of board KB. As illustrated in FIG. 8, in the conveyor devices 41B connected to each other, downstream side end portion 41K of conveyor device 41B positioned on the upstream side is positioned below upstream side end portion 41J of conveyor device 41B positioned on the downstream side. Therefore, the conveyed object that has been conveyed by conveyor device 41B on the downstream side and has reached downstream side end portion 41K drops from there and transfers to upstream side end portion 41J of conveyor device 41B on the upstream side. In this manner, on main conveyor 41, scraps KZ of carrier tape 29, which is the conveyed object, are conveyed from the upstream side to the downstream side.

It is preferable that the plurality of conveyor devices 41B are the same type, and the length (dimension in the X-axis direction) of one conveyor device 41B is the same as the lateral width (dimension in the X-axis direction) of one component mounting device 16. In this case, the number of connected conveyor devices 41B is the same as the number of component mounting devices 16 that configure component mounting device group 16G.

In FIG. 4, sub-conveyor 42 is installed on floor surface FL under feeder cart 27 included in each component mounting device 16. Sub-conveyor 42 is installed for each feeder cart 27 included in each component mounting device 16. In the present embodiment, since each component mounting device 16 has two feeder carts 27 at the front and rear, two sub-conveyors 42 are also installed at the front and rear of each component mounting device 16.

As illustrated in FIG. 7, each sub-conveyor 42 has a configuration in which motor 42M drives belt 42C supported by two side walls 42H that are provided to face each other (here, face each other in the X-axis direction) in the horizontal direction. The operation of motor 42M is controlled by control device 16CT of component mounting device 16 positioned above sub-conveyor 42.

In FIG. 6, of two front and rear sub-conveyors 42 provided corresponding to each component mounting device 16, the one positioned on the front side of component mounting device 16 is connected to main conveyor 41 positioned on the front side. Meanwhile, of the two front and rear sub-conveyors 42 provided corresponding to each component mounting device 16, the one positioned on the rear side of component mounting device 16 is connected to main conveyor 41 positioned on the rear side.

Figure 9:
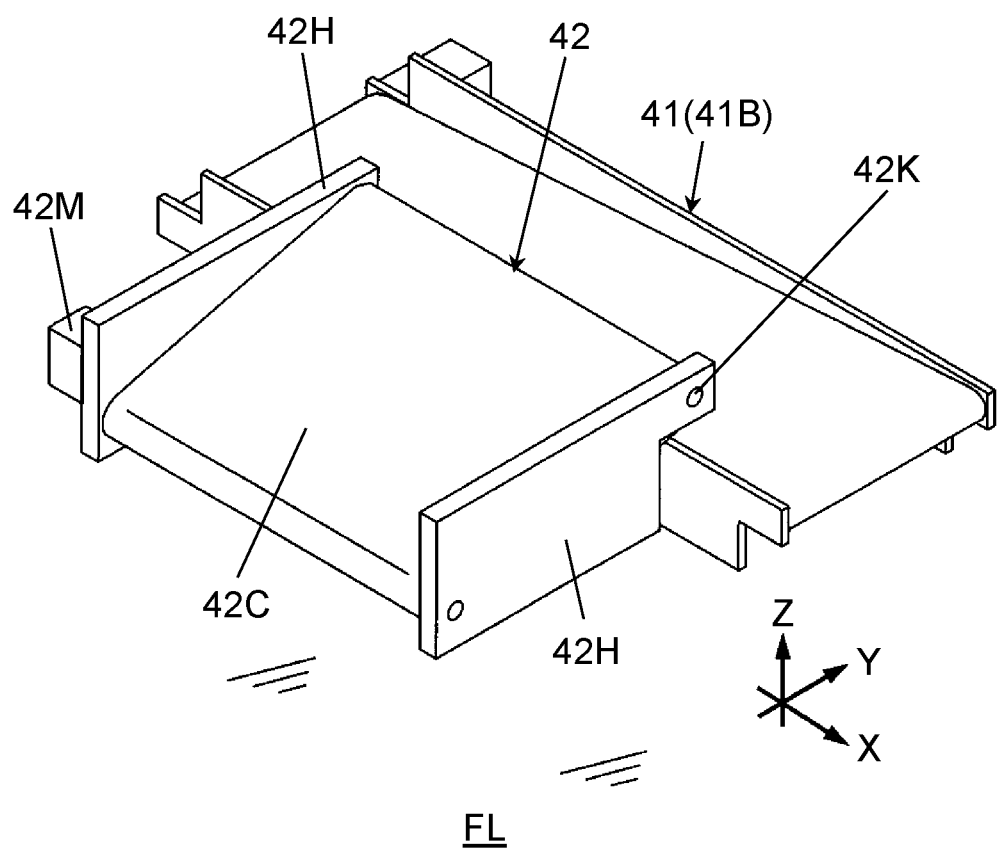
FIG. 9 is a perspective view of a part of the scraps collecting mechanism in the embodiment of the present disclosure.

In FIG. 7, the conveying direction of belt 42C of each sub-conveyor 42 installed on floor surface FL is a horizontal direction. When sub-conveyor 42 is connected to main conveyor 41, downstream side end portion 42K of sub-conveyor 42 in the conveying direction is positioned above main conveyor 41 (FIGS. 4 and 7). Here, the conveying direction of belt 42C of each sub-conveyor 42 is the horizontal direction, but as illustrated in FIG. 9, the belt may be inclined such that the conveying direction is a direction of the slope from the upstream side (feeder cart 27 side) to the downstream side (main conveyor 41 side).

Each sub-conveyor 42 receives scraps KZ of carrier tape 29 discharged from tape feeder 26 of corresponding component mounting device 16 through duct 32. Then, by conveying scraps KZ toward the center portion side of component mounting device 16, and dropping scraps KZ of carrier tape 29 from downstream side end portion 42K in the conveying direction, scraps KZ are delivered to main conveyor 41.

Figure 10A:
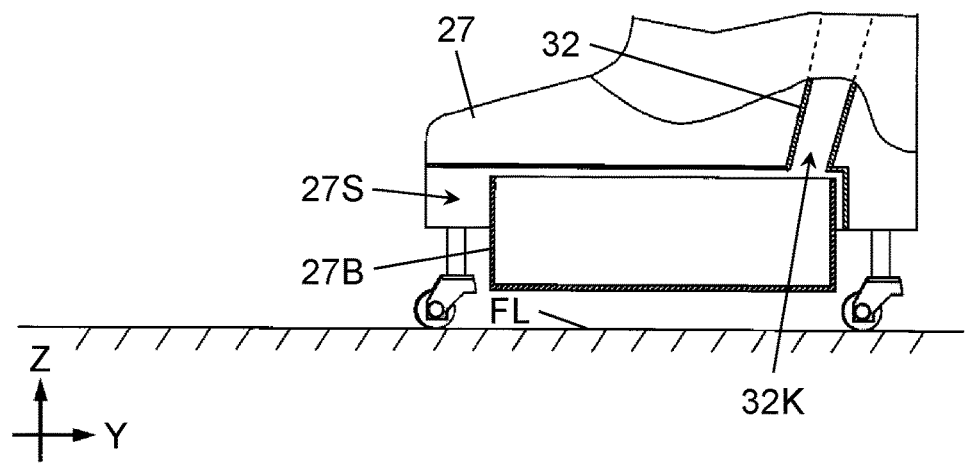
FIG. 10A is a view illustrating a procedure of installing a sub-conveyor that configures the scraps collecting mechanism according to the embodiment of the present disclosure under a feeder cart.
Figure 10B:
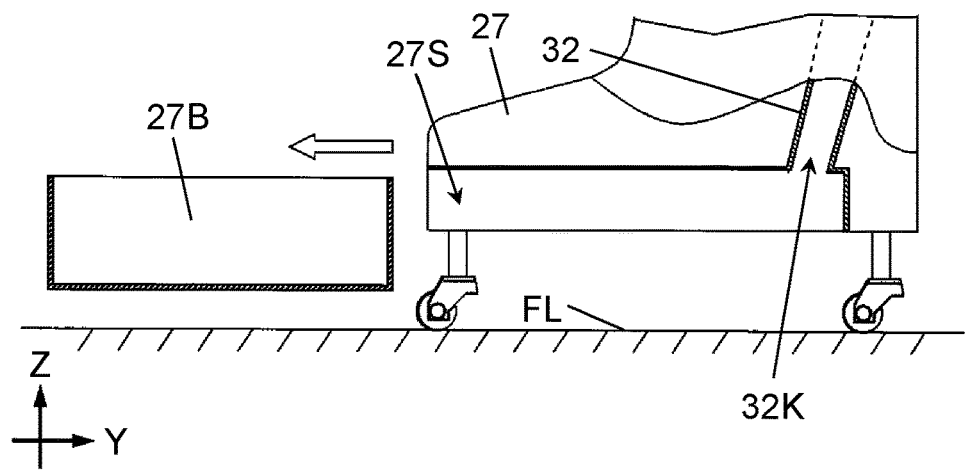
FIG. 10B is a view illustrating a procedure of installing the sub-conveyor that configures the scraps collecting mechanism according to the embodiment of the present disclosure under the feeder cart.
Figure 10C:
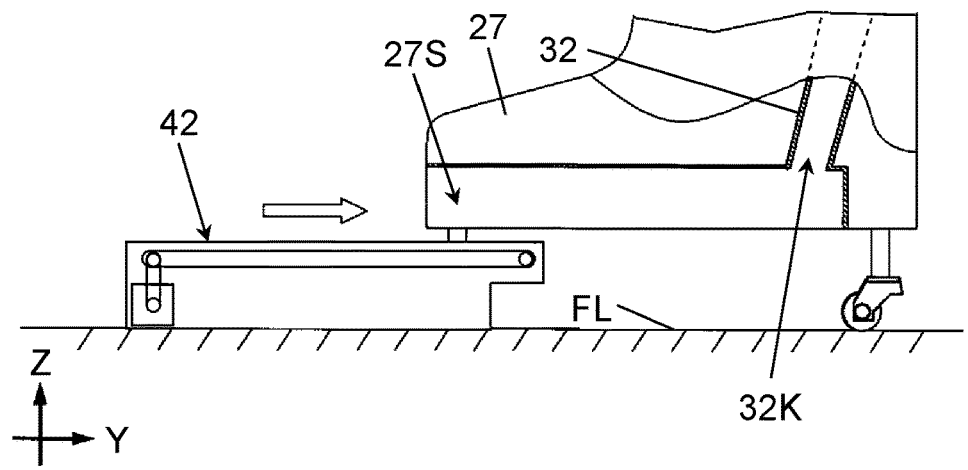
FIG. 10C is a view illustrating a procedure of installing the sub-conveyor that configures the scraps collecting mechanism according to the embodiment of the present disclosure under the feeder cart.

As illustrated in FIG. 10A, container 27B for containing scraps KZ of carrier tape 29 discharged from duct 32 is usually installed in the lower portion of feeder cart 27. In the present embodiment, container 27B is removed from feeder cart 27 of each component mounting device 16 (FIG. 10B), and sub-conveyor 42 is installed by using space 27S above floor surface FL formed by removing container 27B (FIG. 10C). Therefore, each sub-conveyor 42 can be installed after component mounting device group 16G is installed on floor surface FL, and can be connected to main conveyor 41 already installed on floor surface FL.

In FIG. 6, disposing conveyor 43 is installed on an extension line of the arrangement of component mounting device group 16G outside region FA (FIG. 2). In detail, the disposing conveyor is installed on floor surface FL below second relay conveyor 17 at a position in the vicinity of the terminal end portion of main conveyor 41. Each disposing conveyor 43 has a configuration in which motor 43M drives belt 43C supported by two side walls 43H that are provided to face each other (here, face each other in the Y-axis direction) in the horizontal direction. The operation of motor 43M is controlled by the above-described host control system that controls the overall operation of component mounting system 1.

In FIG. 7, in the present embodiment, belt 43C of disposing conveyor 43 is configured to be inclined in the direction of the slope from the upstream side to the downstream side in the conveying direction. Upstream side end portion 43J of disposing conveyor 43 is positioned below downstream side end portion 41K of conveyor device 41B positioned on the most downstream side of the plurality (four here) of conveyor devices 41B that configure main conveyor 41. (FIG. 6). Disposing conveyor 43 receives scraps KZ of carrier tape 29 conveyed by main conveyor 41 to the terminal end portion thereof, and conveys received scraps KZ from downstream side end portion 43K to upstream side end portion 43J.

In FIG. 7, storage box 44 is a box-shaped member that opens upward and is installed outside region FA and on the downstream side of disposing conveyor 43. In a state where storage box 44 and disposing conveyor 43 are connected to each other, downstream side end portion 43K of disposing conveyor 43 is positioned above storage box 44. Scraps KZ of carrier tape 29, which are received from main conveyor 41 by disposing conveyor 43 and conveyed from upstream side end portion 43J toward downstream side end portion 43K, drop from downstream side end portion 43K of disposing conveyor 43 and are disposed of in storage box 44. Storage box 44 stores scraps KZ of carrier tape 29, which are disposed of from disposing conveyor 43.

In this manner, in the present embodiment, disposing conveyor 43 serves as a scraps disposer that receives scraps KZ of carrier tape 29 conveyed by main conveyor 41 and disposes of scraps KZ into storage box 44 disposed outside region FA. Further, storage box 44 is a scraps storage that stores scraps KZ of carrier tape 29 discharged from each of the plurality of tape feeders 26 included in four component mounting devices 16.

When component mounting system 1 is in an operating state and each component mounting device 16 that configures component mounting device group 16G performs a component mounting operation, scraps KZ of carrier tape 29 are generated from component mounting device 16, and scraps KZ are discharged by the own weight drop from duct 32 provided in feeder cart 27. Scraps KZ discharged from duct 32 drop onto sub-conveyor 42 installed under feeder cart 27, and are conveyed by sub-conveyor 42 toward the center portion side of component mounting device 16. Then, scraps KZ drop from downstream side end portion 42K of sub-conveyor 42 and are delivered to main conveyor 41. Main conveyor 41 is always operating during the operation of component mounting device group 16G, and conveys scraps KZ received from each of the plurality of sub-conveyors 42 in the same direction as the flow of board KB. Scraps KZ conveyed by main conveyor 41 are delivered to disposing conveyor 43, and disposing conveyor 43 disposes of scraps KZ into storage box 44.

Here, control device 16CT provided in each component mounting device 16 operates each sub-conveyor 42 in accordance with the cutting operation of cutter device 31 that discharges scraps KZ of carrier tape 29 to sub-conveyors 42. Specifically, when cutter device 31 of feeder cart 27 performs a cutting operation, control device 16CT operates sub-conveyor 42 installed under feeder cart 27 for a predetermined period of time. Scraps KZ of carrier tape 29 discharged from cutter device 31 are delivered from sub-conveyor 42 to main conveyor 41 when sub-conveyor 42 operates for a predetermined period of time. In addition, control device 16CT may operate sub-conveyor 42 every time when a plurality of times of cutting work are operated, instead of operating sub-conveyor 42 every time cutter device 31 performs the cutting work.

As described above, when scraps KZ of carrier tape 29 are stored in storage box 44, and the appropriate time arrives when the amount of accommodated scraps KZ becomes a certain amount, storage box 44 is moved from floor surface FL. Then, scraps KZ are picked up from storage box 44 and discarded. In the present embodiment, as illustrated in FIG. 7, caster 44C is provided at the bottom portion of storage box 44, and storage box 44 can be easily moved on floor surface FL.

As described above, in component mounting system 1 according to the present embodiment, main conveyor 41 is installed so as to extend in the arrangement direction of component mounting devices 16 in the region on floor surface FL under component mounting device group 16G, and scraps KZ of carrier tape 29 discharged from each component mounting device 16 and delivered from sub-conveyor 42 installed under each feeder cart 27 are conveyed outward from underneath of component mounting device group 16G. In addition, scraps KZ of carrier tape 29 conveyed by main conveyor 41 are stored in storage box 44 installed outside region FA. Since storage box 44 stores scraps KZ of carrier tape 29 discharged from all tape feeders 26 included in component mounting device group 16G, by discarding scraps KZ of carrier tape 29 stored in storage box 44, the operator who collects and discards scraps KZ can discard all scraps KZ discharged from four component mounting devices 16 without going around each component mounting device 16.

Further, in component mounting system 1 according to the present embodiment, the controller (here, each control device 16CT of four component mounting devices 16) that controls each of the plurality of sub-conveyors operates each of the plurality of sub-conveyors 42 in accordance with the cutting operation of cutter device 31 that discharges scraps KZ to sub-conveyor 42. Therefore, it is possible to reduce power consumption as compared with a case where the plurality of sub-conveyors 42 are always in the operating state.

Figure 11:
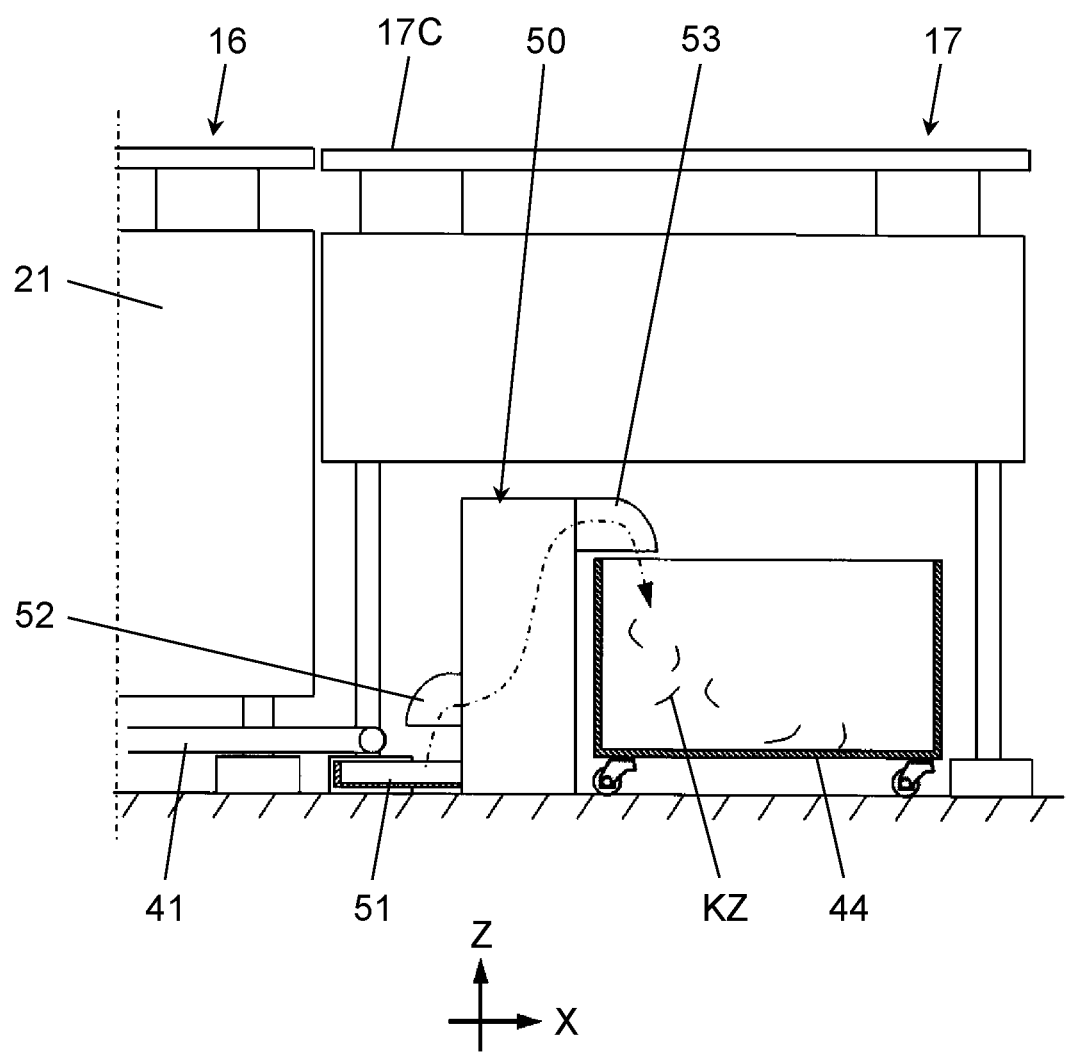
FIG. 11 is a side view of a part of the scraps collecting mechanism according to a first modification example of the embodiment of the present disclosure.

In the first modification example illustrated in FIG. 11, the scraps disposer that receives scraps KZ of carrier tape 29 conveyed by main conveyor 41 and disposes of scraps KZ to storage box 44 is changed from disposing conveyor 43 described above to scraps suction-up device 50. Scraps suction-up device 50 receives scraps KZ of carrier tape 29 that has been conveyed by main conveyor 41 to the terminal end portion thereof by receiving tray 51, and ejects the scraps to storage box 44 from ejection port 53 by suctioning up scraps KZ of carrier tape 29 received by receiving tray 51 from suction-up port 52. Even with such a configuration, it is possible to obtain the same effect as the configuration using disposing conveyor 43.

Figure 12:
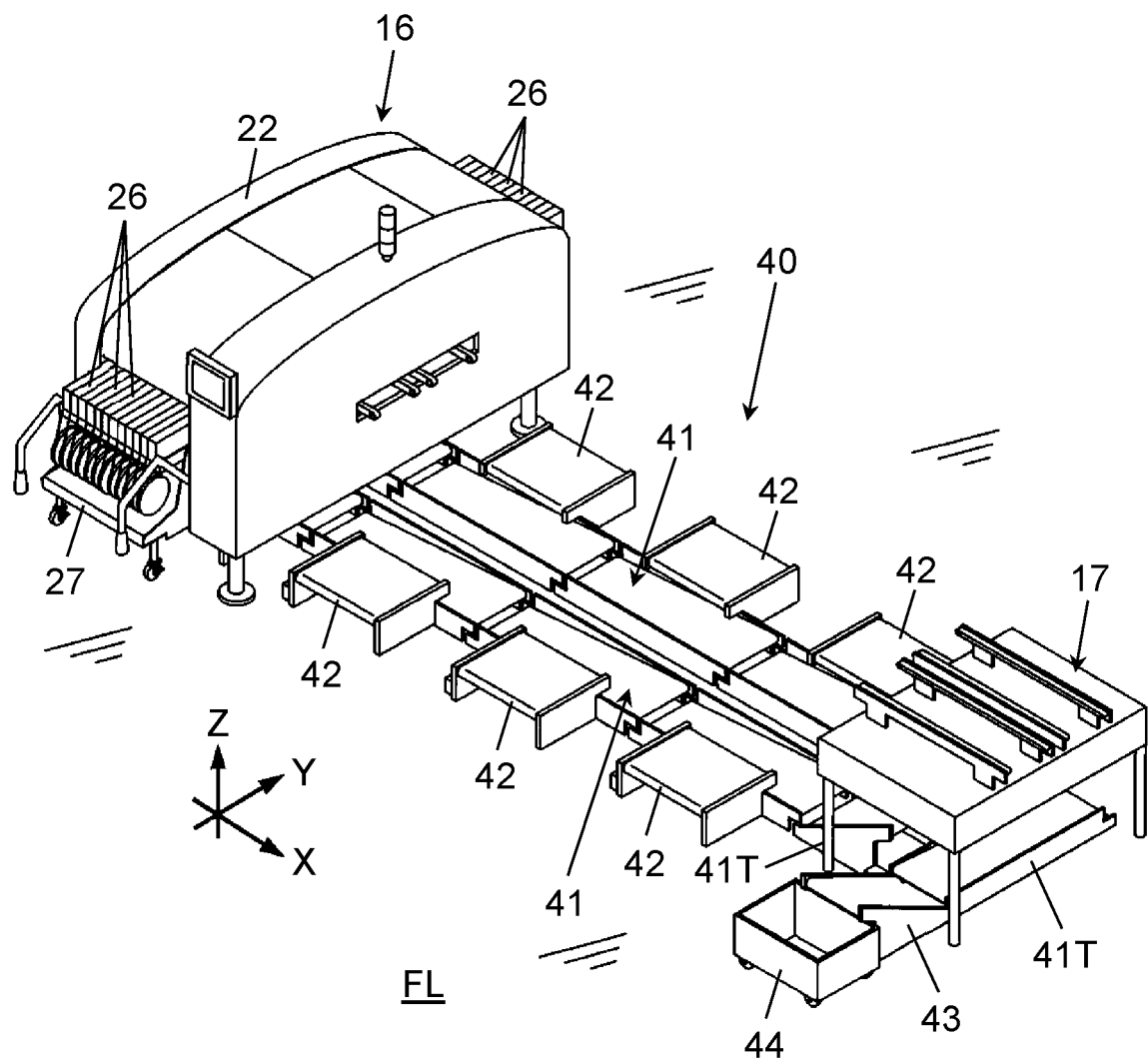
FIG. 12 is a perspective view of the scraps collecting mechanism according to a second modification example of the embodiment of the present disclosure.

A second modification example illustrated in FIG. 12 is an example in which storage box 44 is installed at a position out of the arrangement of the plurality of component mounting devices 16. In the second modification example, the terminal end portion of main conveyor 41 is connected to a direction changing conveyor 41T that changes the conveying direction from main conveyor 41 side to operator OP side (or may be the side opposite to operator OP). Then, after connecting disposing conveyor 43 to the tip of the conveying direction changed by direction changing conveyor 41T, the conveying direction of disposing conveyor 43 is made to coincide with the changed conveying direction. In the second modification example, scraps KZ of carrier tape 29 conveyed by main conveyor 41 can be stored in storage box 44 installed at a position deviated from operator OP side (or the side opposite to operator OP) from the region occupied by component mounting system 1 on floor surface FL. Therefore, the work of moving storage box 44 and discarding scraps KZ is easy, and the workability is improved.

As described above, in component mounting system 1 according to the present embodiment, main conveyor 41 is installed in region FA on floor surface FL under component mounting device group 16G along the arrangement direction of component mounting devices 16, and main conveyor 41 conveys scraps KZ of carrier tape 29 discharged from each of the plurality of component mounting devices 16. In addition, scraps KZ of carrier tape 29 conveyed by main conveyor 41 are stored in storage box 44 installed outside region FA, and collected and discarded in one place. Since main conveyor 41 is installed on floor surface FL as a device separate from each component mounting device 16, there is no need to change the design of the equipment on component mounting device 16 side and the layout can be freely laid out on floor surface FL for general use, and scraps collecting mechanism 40 can be constructed inexpensively.

Although the embodiments of the present disclosure have been described above, the present disclosure is not limited to the description above, and various modifications and the like are possible. For example, in the above-described embodiment, scraps collecting mechanism 40 is configured to include a scraps disposer that receives scraps KZ of carrier tape 29 conveyed by main conveyor 41 and disposes of scraps KZ into storage box 44, but in a case where storage box 44 directly receives scraps KZ of carrier tape 29 conveyed to the terminal end portion by main conveyor 41 (for example, in a case where a recessed portion is provided on floor surface FL and storage box 44 is accommodated in the recessed portion) and the like, the scraps disposer becomes unnecessary. Further, in the above-described embodiment, main conveyor 41 conveys scraps KZ in the direction from the upstream side to the downstream side of the flow of board KB, but on the contrary, scraps KZ may be conveyed in the direction from the downstream side to the upstream side of the flow of board KB.

Further, in the above-described embodiment, scraps collecting mechanism 40 includes the plurality of sub-conveyors 42, and the plurality of sub-conveyors 42 receive scraps KZ of carrier tape 29 discharged from each of the plurality of component mounting devices 16 and deliver the scraps to main conveyor 41, but when main conveyor 41 directly receives scraps KZ discharged from each component mounting device 16, sub-conveyor 42 becomes unnecessary. Further, in the above-described embodiment, each of the plurality of sub-conveyors 42 operates in accordance with the cutting operation of carrier tape 29 by cutter device 31, but similar to main conveyor 41, the sub-conveyor may be always operating during the operation of component mounting device group 16G.

There is provided a component mounting system and a tape scraps collecting device that can inexpensively construct a scraps collecting mechanism that collects the scraps of carrier tape generated from the tape feeder of each component mounting device in one place.

What is claimed is:
1. A component mounting system comprising:
   a component mounting device group including a plurality of component mounting devices, the plurality of component mounting devices being arranged on a floor surface in a direction of conveying a board, the component mounting device group defining a space under the component mounting device group, each of the plurality of component mounting devices being configured to:
      mount a component supplied by a tape feeder from a carrier tape onto the board conveyed from an upstream side; and cut the carrier tape by a cutter device after supplying the component from the carrier tape to the board; and discharge scraps of the carrier tape;

a main conveyor installed along the arrangement of the plurality of component mounting devices, wherein the main conveyor is installed under the component mounting device group, the main conveyor being configured to convey the scraps discharged from the carrier tape;

a direction changing conveyor connected to a terminal end portion of the main conveyor, the direction changing conveyor being configured to change a conveying direction of the scraps delivered by the main conveyor; and a scraps storage installed outside the space, the scraps storage being configured to store the scraps conveyed by the direction changing conveyor.

2. The component mounting system according to claim 1, wherein the main conveyor includes a plurality of conveyor devices connected to each other in series.

3. The component mounting system according to claim 1, further comprising:

a plurality of sub-conveyors installed on the floor surface under a feeder cart that supports the tape feeder, each of the plurality of sub-conveyors being configured to:

receive and convey the scraps discharged from the tape feeder supported by the feeder cart; and deliver the scraps to the main conveyor.

4. The component mounting system according to claim 3, wherein each of the plurality of sub-conveyors is configured to convey the scraps to the main conveyor in a first direction, and the main conveyor is configured to convey the scraps in a second direction being different from the first direction.

5. The component mounting system according to claim 3, further comprising:

a controller configured to operate one sub-conveyor among the plurality of sub-conveyors in accordance with a cutting operation of the cutter device that discharges the scraps to the one sub-conveyor.

6. The component mounting system according to claim 5, wherein, the controller operates the one sub-conveyor that receives the scraps discharged from the cutter device for a predetermined period of time when the cutter device performs the cutting operation.

7. The component mounting system according to claim 1, further comprising:

a scraps disposer configured to dispose of the scraps conveyed by the direction changing conveyor into the scraps storage.

8. The component mounting system according to claim 1, wherein, the scraps storage has a plurality of casters.

* * * * *